(12) United States Patent
Herrmann

(10) Patent No.: US 10,943,892 B2
(45) Date of Patent: Mar. 9, 2021

(54) LIGHT-EMITTING SEMICONDUCTOR CHIP, LIGHT-EMITTING COMPONENT AND METHOD FOR PRODUCING A LIGHT-EMITTING COMPONENT

(71) Applicant: OSRAM Opto Semiconductors GmbH, Regensburg (DE)

(72) Inventor: Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 113 days.

(21) Appl. No.: 16/090,795

(22) PCT Filed: Apr. 10, 2017

(86) PCT No.: PCT/EP2017/058536
§ 371 (c)(1),
(2) Date: Oct. 2, 2018

(87) PCT Pub. No.: WO2017/178421
PCT Pub. Date: Oct. 19, 2017

(65) Prior Publication Data
US 2020/0135705 A1    Apr. 30, 2020

(30) Foreign Application Priority Data

Apr. 11, 2016    (DE) .......................... 102016106571.4

(51) Int. Cl.
*H01L 33/38*    (2010.01)
*H01L 33/52*    (2010.01)
(Continued)

(52) U.S. Cl.
CPC ............ *H01L 25/13* (2013.01); *H01L 33/382* (2013.01); *H01L 33/385* (2013.01);
(Continued)

(58) Field of Classification Search
CPC ....... H01L 33/52; H01L 33/54; H01L 33/382; H01L 33/385; H01L 33/387
See application file for complete search history.

(56) References Cited

U.S. PATENT DOCUMENTS

| 6,730,939 B2 | 5/2004 | Eisert et al. |
| 2008/0093607 A1 | 4/2008 | Feng et al. |

(Continued)

FOREIGN PATENT DOCUMENTS

| DE | 102015104886 A1 | 10/2016 |
| EP | 1256134 B1 | 5/2015 |

(Continued)

*Primary Examiner* — David Vu
*Assistant Examiner* — Brandon C Fox
(74) *Attorney, Agent, or Firm* — Slater Matsil, LLP

(57) ABSTRACT

A light-emitting semiconductor chip, a light-emitting component and a method for producing a light-emitting component are disclosed. In an embodiment a light-emitting semiconductor chip includes a light-transmissive substrate having a top surface, a bottom surface opposite the top surface, a first side and a second side surface arranged opposite the first side surface, a semiconductor body arranged on the top surface of the substrate and a contacting including a first current distribution structure and a second current distribution structure, wherein the first current distribution structure and the second current distribution structure are freely accessible from a side of the semiconductor body facing away from the substrate, and wherein the semiconductor chip, on the side of the semiconductor body facing away from the substrate and on the bottom surface of the substrate, is free of any connection point configured to electrically contact the first and second current distribution structures.

19 Claims, 9 Drawing Sheets

(51) Int. Cl.
 *H01L 25/13* (2006.01)
 *H01L 33/48* (2010.01)
 *H01L 33/54* (2010.01)
 *H01L 33/58* (2010.01)
 *H01L 33/62* (2010.01)

(52) U.S. Cl.
 CPC .......... *H01L 33/387* (2013.01); *H01L 33/486* (2013.01); *H01L 33/52* (2013.01); *H01L 33/54* (2013.01); *H01L 33/58* (2013.01); *H01L 33/62* (2013.01); *H01L 2933/005* (2013.01); *H01L 2933/0066* (2013.01)

(56) References Cited

U.S. PATENT DOCUMENTS

| | | | |
|---|---|---|---|
| 2011/0062484 A1* | 3/2011 | Tanaka | H01L 33/38 257/99 |
| 2012/0085986 A1* | 4/2012 | Iwanaga | H01L 33/38 257/9 |
| 2012/0113673 A1 | 5/2012 | Na et al. | |
| 2013/0256734 A1* | 10/2013 | Yang | H01L 33/642 257/99 |
| 2013/0300812 A1 | 11/2013 | Bibl et al. | |
| 2016/0111400 A1* | 4/2016 | Lin | H01L 24/96 257/88 |
| 2018/0102466 A1 | 4/2018 | Herrmann | |

FOREIGN PATENT DOCUMENTS

| | | |
|---|---|---|
| JP | 2013258371 A | 12/2013 |
| WO | 2009098636 A1 | 8/2009 |

\* cited by examiner

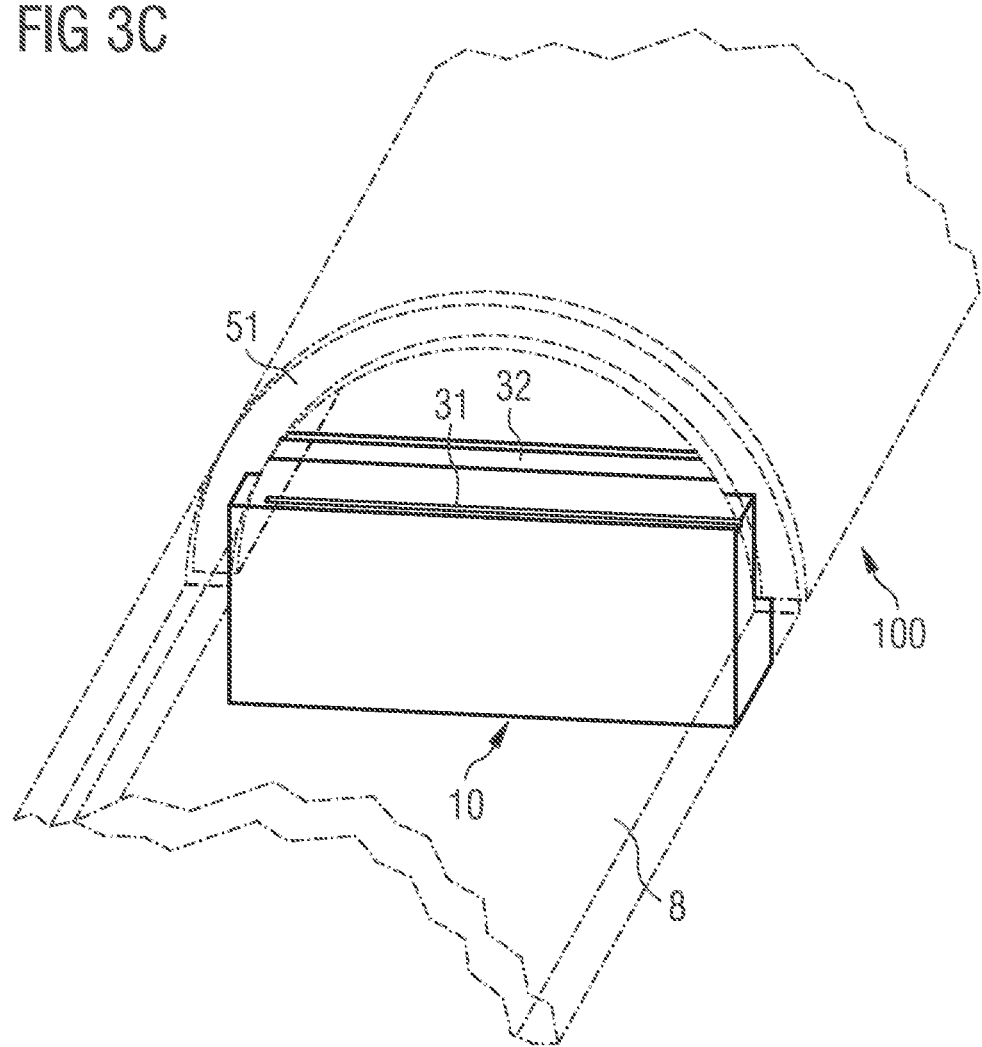

LIGHT-EMITTING SEMICONDUCTOR CHIP, LIGHT-EMITTING COMPONENT AND METHOD FOR PRODUCING A LIGHT-EMITTING COMPONENT

This patent application is a national phase filing under section 371 of PCT/EP2017/058536, filed Apr. 10, 2017, which claims the priority of German patent application 10 2016 106 571.4, filed Apr. 11, 2016, each of which is incorporated herein by reference in its entirety.

TECHNICAL FIELD

A light-emitting semiconductor chip and a light-emitting component are provided. Further, a method for producing a light-emitting component is provided.

BACKGROUND

European Patent No. EP 1256134 B1 describes a light-emitting semiconductor chip.

SUMMARY OF THE INVENTION

Embodiments provide a light-emitting semiconductor chip, in which a particularly large proportion of the outer surface is available for emitting light. Further embodiments provide a light-emitting component, which is particularly easy to produce. Yet other embodiments provide a method for producing a light-emitting component that is particularly cost-effective to produce.

A light-emitting semiconductor chip is provided. For example, the semiconductor chip is a luminescent diode chip such as a laser diode chip or a light emitting diode chip.

The light-emitting semiconductor chip generates light during operation, i.e., electromagnetic radiation in the spectral range of infrared radiation to UV radiation, in particular in the spectral range of visible light.

According to at least one embodiment of the light-emitting semiconductor chip, the semiconductor chip comprises a light-transmissive substrate. The substrate may in particular be a growth substrate for a semiconductor body of the light-emitting semiconductor chip. In this case it is in particular possible that the substrate may be formed to be light-transmissive. In this case, it is possible in particular for the light-transmissive substrate to be formed with sapphire or to consist of sapphire.

The substrate comprises a top surface, which is formed, for example, by a main surface of the substrate. Furthermore, the substrate comprises a bottom surface opposite the top surface, which may also be formed by a further main surface of the substrate. Furthermore, the substrate comprises a first side surface, which extends transversely or perpendicularly to the bottom surface. The first side surface may in particular also extend transversely or perpendicularly to the top surface. Furthermore, the substrate comprises a second side surface which is arranged opposite the first side surface.

According to at least one embodiment of the light-emitting semiconductor chip, the light-emitting semiconductor chip comprises a semiconductor body on the top surface of the substrate. The semiconductor body is, for example, deposited epitaxially on the substrate on the top surface of the substrate. The semiconductor body may be formed, for example, with a III-V compound semiconductor material, in particular, the semiconductor body may be formed with a nitride compound semiconductor material.

The semiconductor body comprises an active region, which is formed for generating light. That is to say that during operation of the light-emitting semiconductor chip the active region is supplied with current, which leads to the generation of light, which leaves the light-emitting semiconductor chip at least partially.

According to at least one embodiment of the light-emitting semiconductor chip, the light-emitting semiconductor chip comprises a contacting, which is formed to supply the active region with current. By means of the contacting, current is injected into the semiconductor body of the light-emitting semiconductor chip and distributed in the semiconductor body of the light-emitting semiconductor chip, so that the active region may be supplied with current as evenly as possible over its entire surface. The contacting comprises a first current distribution structure and a second current distribution structure. For example, the first current distribution structure is formed for supplying current to the active region on the p-side. The second current distribution structure is then formed for supplying current to the active region on the n-side or vice versa.

According to at least one embodiment of the semiconductor light-emitting chip, the first current distribution structure and the second current distribution structure are freely accessible from a side facing away from the substrate of the semiconductor body. That is to say, the first current distribution structure and the second current distribution structure are freely accessible on a top surface of the semiconductor body and may be electrically contacted there, for example. The current distribution structures extend, for example, in places over the top surface of the semiconductor body facing away from the substrate. The second current distribution structure may be arranged on the top surface without protruding into the semiconductor body. The first current distribution structure may then be arranged in a trench, which is formed in the semiconductor body and, for example, be in direct contact with an n-conducting semiconductor region of the semiconductor body. The trench, in which the first current distribution structure is located, then penetrates the active region.

For example, the first and second current distribution structures may be a conductor track with a uniform width within the manufacturing tolerance. The current distribution structures may, for example, extend parallel to a longitudinal axis of the top surface of the semiconductor body facing away from the substrate. For example, the current distribution structures may extend to an edge of the semiconductor body, where the semiconductor body is adjacent to the first side surface or the second side surface. On the opposite side surface, there may be a distance between the current distribution structures and the associated edge of the semiconductor body. Different current distribution structures extend in particular to different edges. Furthermore, it is possible that the current distribution structures have a distance of at least 10 µm, in particular of at least 25 µm, from each edge of the semiconductor body.

According to at least one embodiment of the light-emitting semiconductor chip, the semiconductor chip on the side of the semiconductor body facing away from the substrate and the semiconductor chip on the bottom surface of the substrate is free of any connection point, which is formed for electrically contacting the current distribution structures. That is to say that the light-emitting semiconductor chip does not have any connection points either on its top surface or on its bottom surface, which are intended, for example, for wire contact, for solder contact or for contact by means of a conductive adhesive. In particular, it is possible that the current distribution structures are the only freely accessible electrically conductive components on the top surface of the semiconductor body facing away from the substrate and that the bottom surface of the substrate is also free of electrically conductive structures. That is to say that neither connection areas such as a bonding pad are arranged on the top surface of the semiconductor body facing away from the substrate, nor are connection points for making electrical contact with the semiconductor body arranged on the bottom surface of the substrate.

The current distribution structures may follow predetermined straight lines or lines on the top surface of the semiconductor body facing away from the substrate, wherein the current distribution structures have a uniform thickness along these straight lines or lines and, for example, have no wider region, which may be used as a bonding pad or the like.

The first side surface of the light-transmissive substrate is arranged in the region of a first end face of the light-emitting semiconductor chip. In addition to the first side surface of the light-transmissive substrate, the first end face of the light-emitting semiconductor chip comprises a first side surface of the semiconductor body, which can be flush with the first side surface of the substrate at the first end face. In the same way, the light-emitting semiconductor chip can have a second end face opposite the first end face, which comprises the second side surface of the light-transmissive substrate and a corresponding second side surface of the semiconductor body.

According to at least one embodiment of the light-emitting semiconductor chip, the first current distribution structure has a smaller distance to the first side surface of the substrate and in particular to the first end face of the semiconductor chip than the second current distribution structure. In the same way, the second current distribution structure has a smaller distance from the second side surface of the substrate and in particular to the second end face of the semiconductor chip than the first current distribution structure.

This is to say that the first current distribution structure is, for example, closer to the first side surface of the substrate than the second current distribution structure and the second current distribution structure is arranged closer to the second side surface of the substrate than the first current distribution structure. In this case, it is possible that the first current distribution structure is guided to the first end face of the semiconductor chip and is, for example, flush with the first side surface of the substrate and/or the first side surface of the semiconductor body.

In the same way, the second current distribution structure can be guided to the second end face of the semiconductor chip, where it can, for example, be flush with the second side surface of the substrate and/or the second side surface of the semiconductor chip. In other words, the shape of the first and second current distribution structures of the light-emitting semiconductor chip is formed such that different current distribution structures are arranged differently close to different end faces of the semiconductor chip. In this way it is possible to electrically contact the semiconductor chip at each of its end faces, wherein the current distribution structure that is arranged closer to the respective end face is electrically connected. Due to the fact that the other current distribution structure is arranged at a greater distance from the end face, the risk of a short circuit during contacting is greatly reduced.

According to at least one embodiment, a light-emitting semiconductor chip is provided having a light-transmissive substrate, which has a top surface, a bottom surface opposite the top surface, a first side surface extending transversely or perpendicularly to the bottom surface, and a second side surface, which is arranged opposite the first side surface; a semiconductor body on the top surface of the substrate, which comprises an active region formed for generating light; and a contacting comprising a first current distribution structure and a second current distribution structure, which is formed to supply current to the active region, wherein the first current distribution structure and the second current distribution structure are freely accessible from a side of the semiconductor body facing away from the substrate; the semiconductor chip on the side of the semiconductor body facing away from the substrate and the semiconductor chip on the bottom surface of the substrate is free of any connection point, which is formed for electrically contacting the first and second current distribution structures; the first current distribution structure has a smaller distance to the first side surface than the second current distribution structure; and the second current distribution structure has a smaller distance from the second side surface than the first current distribution structure.

A light-emitting semiconductor chip described here is based, among other things, on the following consideration: With conventional light-emitting semiconductor chips, connecting points, which are provided for electrical contacting of the current distribution structures of the light-emitting semiconductor chip, occupy a part of the top surface of the semiconductor body facing away from the substrate. Since these connection points are typically metallic, no light can pass through them during the operation of the semiconductor chip. It is thereby possible that the light-emitting surface of the semiconductor chip is reduced. In the same manner, connection points on the bottom surface of the substrate facing away from the semiconductor body lead to a reduced light generation, since plated-through holes through the active region must be available for such connection points, which reduce the area via which light is generated in the light-emitting semiconductor chip.

In the light-emitting semiconductor chip described here, there are therefore no such connection points on the side of the semiconductor body facing away from the substrate and on the bottom surface of the substrate, which leads to an increase in the area available for light emission. With a light-emitting semiconductor chip described here, it is possible, for example, that at least 90%, in particular at least 95%, of the entire outer surface of the chip is available for direct light emission. That is to say, light can pass through at least 90% of the outer surface of the chip without being prevented from being emitted by, for example, a connection point.

According to at least one embodiment of the light-emitting semiconductor chip, the semiconductor chip on the side of the semiconductor body facing away from the substrate and the semiconductor chip on the bottom surface of the substrate is free of any connection point, which is formed for electrically contacting the current distribution structures. That is to say that in this case it is possible that the light-emitting semiconductor chip only comprises the current distribution structures as components for making contact with the active region and no further connection points, such as, for example, bonding pads, which are electrically conductively connected to the current distribution structures.

According to at least one embodiment of the light-emitting semiconductor chip, the first current distribution structure has an end region on the first side surface, in which the first current distribution structure extends transversely or perpendicularly to a longitudinal axis of the top face of the semiconductor body facing away from the substrate and/or the second current distribution structure has an end region on the second side surface, in which the second current distribution structure extends transversely or perpendicularly to the longitudinal axis.

That is to say, according to this embodiment, at least one of the current distribution structures does not extend in a straight line over its entire length, for example, parallel to the longitudinal axis of the top surface of the semiconductor body, but the current distribution structure has a section in an end region, in which it extends transversely or perpendicularly to the longitudinal axis or transversely or perpendicularly to the remaining course of the current distribution structure.

The end region is located on the side surface of the substrate, to which the current distribution structure has a smaller distance than the other current distribution structure. Due to the end region, the current distribution structure can be better contacted there, since an area for contacting the current distribution structure is increased. This allows particularly secure operation of the semiconductor chip.

The current distribution structure can also extend in its end region over the entire width, perpendicular to the longitudinal axis, of the top surface of the semiconductor body. In this case, a particularly large area is available for contacting the current distribution structure.

Furthermore a light-emitting component is provided. The light-emitting component can be, for example, a light-emitting diode. The light-emitting component can comprise a light-emitting semiconductor chip, which can be, for example, a light-emitting diode chip. In this case it is possible that the light-emitting semiconductor chip is a light-emitting semiconductor chip described here. This means that all features disclosed for the light-emitting semiconductor chip are also disclosed for the light-emitting component and vice versa. However, it is also possible for the light-emitting semiconductor chip to be a different, for example, a conventional light-emitting semiconductor chip, which does not have to have all the features disclosed in connection with the light-emitting semiconductor chips described here.

According to at least one embodiment, the component comprises a light-emitting semiconductor chip, which comprises a first end face and a second end face opposite the first end face. Each of the end faces comprises, for example, a side surface of a semiconductor body of the light-emitting semiconductor chip. In the event that the light-emitting semiconductor chip comprises a carrier or a substrate, each end face can furthermore comprise a side surface of the substrate or of the carrier.

This also means that the end faces of the light-emitting semiconductor chip are those outer surfaces of the semiconductor chip, which extend transversely or perpendicularly to a main plane of extension of the semiconductor body of the semiconductor chip. In particular, an active region of the light-emitting semiconductor chip, in which the light emitted by the semiconductor chip is generated during operation of the semiconductor chip, may then have a main plane of extension which extends transversely or perpendicularly to the end faces.

In the event that the light-emitting semiconductor chip is not formed to be cube-shaped, but, for example, has the shape of a square or rectangular column, the first end face and the second end face are each the side surfaces of the light-emitting semiconductor chip, which have the smallest area. Further side surfaces of the light-emitting semiconductor chip, which are arranged perpendicularly or transversely to the end faces, then have a surface area, which is larger than the surface area of the end faces. For example, the surface area of such a side surface can be at least twice as large as the surface area of one of the end faces.

According to at least one embodiment of the light-emitting component, the light-emitting component comprises a light-transmissive casing. The casing is formed with an electrically insulating material. This makes it possible for the casing to electrically insulate the current distribution structures from one another.

The light-transmissive casing can be formed, for example, with a light-transmissive plastic material such as silicone, epoxy resin or silicone-epoxy hybrid material. Furthermore, the casing can contain one of the following materials or consist of one of the following materials: fluoropolymer, polymer, PMMA, polycarbonate, polystyrene, COP, COC, polyetherane, polyetherane-based light-transmissive mold material with the use of aliphatic isocyanates, glass, light-transmissive ceramic material.

The light-transmissive casing can be clear transparent. Furthermore, it is possible that the light-transmissive plastic material comprises a light-permeable plastic material, into which particles of further materials are introduced. The further materials can be, for example, at least one of the following materials: luminescence conversion material, color pigment, light-diffusing material, light-reflecting material, light-absorbing material.

The casing is in particular formed for injection casting or injection molding. That is to say that the casing can be produced using methods such as injection casting or injection molding.

According to at least one embodiment, the light-emitting component comprises a first connection element and a second connection element, wherein the two connection elements are each provided for electrically contacting the light-emitting semiconductor chip. For this purpose, the connection elements are formed with an electrically conductive material, in particular with at least one metal. The connection elements have a freely accessible outer surface, which is formed for electrical connection, for example, by means of adhesive bonding or soldering. Furthermore, the connection elements can be designed to be light-reflecting. That is to say that the connection elements then have at least one layer or at least one region, which is formed to be light-reflecting and for which the light emitted during operation in the light-emitting semiconductor chip, for example, has a reflectivity of at least 75 percent, in particular of at least 85 percent. The connection elements can be formed at least in places with a metal such as gold, silver, aluminum, nickel or rhodium.

According to at least one embodiment of the light-emitting component, the casing completely surrounds the light-emitting semiconductor chip in places. That is to say that the light-emitting casing surrounds the light-emitting semiconductor chip, for example, at its bottom surface, its top surface facing away from the bottom surface and its side surfaces, wherein each of these surfaces being surrounded in places by the casing. However, at least the first end face and the second end face remain free of the casing.

According to at least one embodiment of the light-emitting component, the light-emitting semiconductor chip protrudes from the casing at the first end face and at the second end face. This means that at least the two end faces are free of the casing. In particular, it is possible that a region between each end face and the casing is free of the casing and the semiconductor chip is not covered by the material of the casing in this region. For example, each of the end faces has a distance to the casing, which can be selected to be of equal size within the scope of the production tolerance for both end faces.

In other words, the majority of the outer surface of the semiconductor chip, for example, up to 90 percent of the outer surface of the semiconductor chip, is preferably covered by the casing and a small area of the outer surface of the semiconductor chip is uncovered by the casing. In this case, the uncovered regions comprise at least the end faces of the semiconductor chip and, adjacent to the end faces, for example, a circumferential region, in which the semiconductor chip is free of the casing on the bottom surface, the top surface and the side surfaces, which connect the bottom and the top surfaces to one another.

According to at least one embodiment of the light-emitting component, the first connection element and the second connection element contact the light-emitting semiconductor chip in the region of one of the end faces repetitively. That is to say that where the semiconductor chip is free of the casing, at least some of the material of at least one connection element is arranged, which then contacts the semiconductor chip. For example, the first connection element contacts the light-emitting semiconductor chip on the n-side, while the second connection element contacts the light-emitting semiconductor chip on the p-side or vice versa. In other words, the first and the second connection element contact the light-emitting semiconductor chip from two different sides.

According to at least one embodiment, a light-emitting component is provided with a light-emitting semiconductor chip, which comprises a first end face and a second end face opposite the first end face; a casing which is formed to be light-transmissive; a first connection element for electrically contacting the light-emitting semiconductor chip; and a second connection element for electrically contacting the light-emitting semiconductor chip, wherein the casing surrounds the light-emitting semiconductor chip in places; the light-emitting semiconductor chip protrudes from the casing at the first end face; the light-emitting semiconductor chip protrudes from the casing at the second end face; the first connection element and the second connection element contact the light-emitting semiconductor chip in the region of one of the end faces respectively.

A light-emitting component described here is based, inter alia, on the following considerations. In the present case, the light-emitting component can have a minimum of components. Thus, it is possible that the light-emitting component consists of the light-emitting semiconductor chip, the casing and the two connection elements. The light-emitting component then has no further component. In this case, the light-emitting component is formed, for example, by a metal-coated light-transmissive rod in the interior of which the light-emitting semiconductor chip is arranged. As a result, it is also possible that particularly simple designed light-emitting semiconductor chips are able to be used, which are free of any connection elements on their outer surface, for example, with the exception of current distribution structures.

The casing surrounds a large part of the light-emitting semiconductor chip, which enables a mechanically particularly stable light-emitting component. In addition to its optical properties and its properties to protect the light-emitting component from mechanical and chemical loading, the casing also acts as a connection carrier, which can be in direct contact with the connection elements, for example. A robust and geometry-tolerant connection technique is made possible by the connection elements The direct contact between the connection element and the casing further enables good thermal contact between the connection elements and the casing. In this way, it is possible that both the heat generated in the light-emitting semiconductor chip during operation and heat, which, for example, is generated in the casing when light from the light-emitting semiconductor chip is converted to light, in particular at longer wavelengths, can be dissipated through the connection elements.

During the production of the light-emitting component, lithography processes can advantageously be dispensed with. The bottom surface and the side surfaces of the light-emitting semiconductor chip can be mirrored. For this purpose, for example, metallic mirrors can be used, which can be formed, for example, with silver or aluminum. Furthermore, dielectric mirrors or Bragg mirrors can be used. The reflective materials can be applied directly to the outer surface of the semiconductor chip or to the outer surface of the casing. In the latter case, a mirror coating can also be carried out, for example, by applying light-diffusing or light-reflecting material to the casing or after polymerization of the casing.

In the event that reflective layers are dispensed with, the light-emitting component can be a component, which can simultaneously radiate in different spatial directions. For example, the light-emitting component can emit light from the entire outer surface of the light-emitting semiconductor chip apart from the end faces of the light-emitting semiconductor chip.

In addition to their electrical properties for supplying current to the light-emitting semiconductor chip, the connection elements serve as a light reflector, as a heat spreader, as a solder contact for mounting the light-emitting component and/or as an interconnection element for wiring a plurality of light-emitting semiconductor chips or a plurality of light-emitting components. The light-emitting component can be used as a replacement for conventional light-emitting components, for example, as a replacement for conventional light-emitting diodes, in existing designs. Furthermore, it is possible to provide completely new types of lighting modules or lamps with the light-emitting component.

According to at least one embodiment of the light-emitting component, the first connection element completely covers the first end face and the second connection element completely covers the second end face. In this case, the production of the light-emitting component is particularly simple, since the respective connection element can be applied to the associated end face of the light-emitting semiconductor chip over the whole area without further measures for structuring. An electrical separation between the connection elements is then effected by the casing, which covers the light-emitting semiconductor chip at places where it is uncovered by the connection elements. This also means that the outer surface of the light-emitting semiconductor chip in this embodiment of the light-emitting component is completely covered by the casing and the two connection elements and is not exposed at any place.

According to at least one embodiment of the light-emitting component, the first connection element covers the first end face and the second end face and the second connection element likewise covers the first end face and the second end face. In this case, the connection elements extend, for example, in each case from the first end face to the second end face. In this case, the first connection element and the second connection element are arranged, for example, on the casing and are spaced apart from one another in a direction perpendicular to a connecting axis of the first end face and the second end face.

With such an arrangement of the connection elements, it is possible that the connection elements cover the light-emitting semiconductor chip on a side surface that extends transversely or perpendicularly to the end surfaces and/or on the bottom surface as large as possible. In these regions, the connection elements act in particular as reflectors for the light emitted by the light-emitting semiconductor chip during operation. This design is particularly well suited for a light-emitting component having two or more light-emitting semiconductor chips, which can be connected to one another in series by the first and second connection elements, for example.

According to at least one embodiment of the light-emitting component, the first connection element and the second connection element are in direct contact with the light-emitting semiconductor chip and the casing. Where the first connection element and the second connection element electrically contact the light-emitting semiconductor chip, there can be direct contact between the light-emitting semiconductor chip, for example, a current distribution structure of the semiconductor chip, and the respective connection element. Furthermore, the connection element can adjoin the casing or cover the casing while in direct physical contact with the casing. This enables particularly good mechanical and chemical protection of the light-emitting semiconductor chip, as in this case it can be completely surrounded by material of the casing and the material of the connection elements, and each connection element adheres to both the semiconductor chip and the casing, which reduces the risk of delamination of the connection elements.

According to at least one embodiment of the light-emitting component, the light-emitting component comprises two or more light-emitting semiconductor chips, which are electrically conductively connected to one another. In this case, the light-emitting semiconductor chips are electrically conductively connected to one another, in particular via the connection elements. The light-emitting semiconductor chips can be connected, for example, parallel to one another or in series with one another by the connection elements. In other words, semiconductor chips which are adjacent to one another are electrically conductively connected to one another by the first connection element and/or the second connection element.

In this case, it is possible that a connection element in a first light-emitting semiconductor chip of the component acts as a first connection element, which is connected, for example, to the light-emitting semiconductor chip on the n-side and acts as a second connection element in the adjacent light-emitting semiconductor chip, which is connected, for example, to the light-emitting semiconductor chip on the p-side. In other words, adjacent light-emitting semiconductor chips can share a connection element, which can represent a first or a second connection element for the respective light-emitting semiconductor chip.

In this embodiment, the light-emitting component then comprises, for example, a plurality of first and a plurality of second connection elements. The light-emitting semiconductor chips of the light-emitting component are then mechanically connected to one another by the common casing.

According to at least one embodiment, the light-emitting semiconductor chip of the light-emitting component is formed by a light-emitting semiconductor chip described here. In this case, the first end face comprises the first side surface of the substrate and the second end face comprises the second side surface of the substrate. Each of the current distribution structures of the light-emitting semiconductor chip described here is connected to precisely one of the connection elements and is in direct contact therewith. That is to say that the light-emitting semiconductor chip is connected directly to its current distribution structure in particular direct contact between a connection element and the current distribution structure.

According to at least one embodiment of the light-emitting component, the casing completely covers one of the current distribution structures in the region of each of the end faces and another of the current distribution structures protrudes from the casing and is free from the casing in places.

In the case of light-emitting semiconductor chips described here, the first current distribution structure has a smaller distance from the first side surface of the substrate and thus to the first end face of the semiconductor chip than the second current distribution structure. The second current distribution structure has a smaller distance from the second side surface and thus to the second end face of the semiconductor chip than the first current distribution structure. This arrangement of the current distribution structures relative to the two end faces makes it possible to completely surround one of the current distribution structures with the material of the casing, while the other current distribution structure protrudes from the envelope in the region of the same end face.

Due to the electrically insulating properties of the casing, a current distribution structure is electrically insulated through the casing at each end face in this embodiment of the light-emitting component and the other current distribution structure can be contacted. This makes it possible to arrange the connection elements on the end faces of the light-emitting semiconductor chip without further structuring measures and in order to contact precisely one current distribution structure without the risk of short-circuiting the other current distribution structure, as it is covered by the casing. This enables a particularly simple and thus cost-effective production of the light-emitting component.

According to at least one embodiment of the light-emitting component, the light-emitting component comprises a light guide. The light guide can be, for example, a rod or a plate, which is formed with a radiation-transmissive material. The radiation-transmissive material is, for example, a material which is clear, transparent or translucent for white light. For this purpose, the light guide can be formed with a plastic or with a glass.

The at least one light-emitting semiconductor chip of the light-emitting component is arranged on an end face of the light guide. For example, two or more of the light-emitting semiconductor chips are arranged on the end face of the light guide. The at least one light-emitting semiconductor chip of the light-emitting component radiates a majority of the light emitted by it through the end face into the light guide during operation.

Furthermore, in the present embodiment of the light-emitting component, the first connection element and/or the second connection element covers an outer surface of the light guide in places. That is to say that at least one of the connection elements covers, for example, a bottom surface of the light guide extending perpendicularly or transversely to the end face of the light guide in places or completely. In other words, at least one of the connection points has a particularly large surface area, which facilitates the electrical contactability and the dissipation of heat during operation of the component through the connection element. In addition, the connection element can serve as a reflector of the light guide. That is to say that the connection element is formed, for example, with a highly light-reflecting metal such as aluminum and/or silver and, for example, forms a reflector on the bottom surface of the light guide, which reflects incident light in the direction of a top surface of the light guide facing away from the bottom surface.

In addition, a method for producing a light-emitting component is provided. In particular, light-emitting components described here can be produced using the method. That is to say that all the features disclosed for the light-emitting components are also disclosed for the method and vice versa. In particular, light-emitting semiconductor chips described here can also be used in the production, that is to say, all the features disclosed for the light-emitting semiconductor chips are also disclosed for the method and vice versa.

According to at least one embodiment of the method, the method comprises a method step, in which a mold is provided. The mold is, for example, an injection cast or injection mold. The mold has an opening, in which a first recess and a second recess are arranged. That is to say that in the opening of the mold, for example, tapering regions are arranged, which are the recesses. The recesses are formed in particular in such a way that they are suitable for receiving a light-emitting semiconductor chip, for example, on the end faces thereof. The size and shape of the recesses can therefore be such that a light-emitting semiconductor chip is surrounded by the mold in the region of the recess.

According to at least one embodiment of the method, a light-emitting semiconductor chip is provided, which comprises a first end face and a second end face opposite the first end face. The light-emitting semiconductor chip can be, for example, a light-emitting semiconductor chip described here or a light-emitting semiconductor chip, as described in connection with the light-emitting component.

According to at least one embodiment of the method, the light-emitting semiconductor chip is inserted into the opening of the mold such that the first end face is arranged in the first recess and the second end face is arranged in the second recess. That is to say that the recesses have, for example, a contour which corresponds to the contour of the light-emitting semiconductor chip at its end faces. The light-emitting semiconductor chip inserted into the opening of the mold can then be in direct contact with the mold in the region of the recesses and lie there. Remote from the recesses in the opening, the light-emitting semiconductor chip can be freely accessible from its outer surface, so that it is possible to introduce a casing, which completely surrounds the light-emitting semiconductor chip in places.

According to at least one embodiment of the method, the method comprises a step in which a casing, which is formed to be light-transmissive, is introduced into the opening such that the casing surrounds the light-emitting semiconductor chip except for the regions of the light-emitting semiconductor chip, which are arranged in the first recess and in the second recess. That is to say that the recesses keep a part of the outer surface of the light-emitting semiconductor chip free of the casing, for example, in such a way that the light-emitting semiconductor chip protrudes from the casing at the first end face and at the second end face after the casing has been coated. The recesses are formed so deep, for example, that only one current distribution structure protrudes from the casing at each end face, in the event that a light-emitting semiconductor chip described here is used as the light-emitting semiconductor chip.

According to at least one embodiment of the method, the mold is removed in a next method step, for example, after partial curing or complete curing of the casing. After the removal of the mold, a light-emitting semiconductor chip coated with the casing is present, which is free of the casing at least at its end faces.

According to at least one embodiment of the method described here, a first connection element and a second connection element are applied in a method step for electrically contacting the light-emitting semiconductor chip in regions of the light-emitting semiconductor chip not covered by the casing. The connection element can be applied, for example, by sputtering or by casting with electrically conductive material.

The result is a light-emitting component, as described here, for example.

According to at least one embodiment of the method, the method comprises the following steps: providing a mold having an opening, a first recess in the opening and a second recess in the opening; providing a light-emitting semiconductor chip comprising a first end face and a second end face opposite the first end face; inserting the light-emitting semiconductor chip into the opening of the mold such that the first end face is arranged in the first recess and the second end face is arranged in the second recess; introducing a casing, which is formed to be light-transmissive, into the opening such that the casing surrounds the light-emitting semiconductor chip except for the regions of the light-emitting semiconductor chip, which are arranged in the first recess and in the second recess; removing the mold; and applying a first connection element and a second connection element for electrically contacting the light-emitting semiconductor chip in regions of the light-emitting semiconductor chip not covered by the casing.

The method steps can be carried out in particular in the order described.

The fact that the light-emitting semiconductor chips in the region of their end faces remain free from the casing through the mold, it is possible to apply the connection elements in a method step, for which no further adjustment steps are necessary. In other words, applying the connection points takes place in a self-aligning manner. The connection points can in this case take over electrical, optical and thermal tasks in the finished light-emitting component.

According to at least one embodiment of the method, two or more light-emitting semiconductor chips are provided, wherein the mold has a first recess and a second recess for each of the semiconductor chips. The light-emitting semiconductor chips can then be surrounded by the casing in the manner described, wherein the light-emitting semiconductor chips are connected to one another by the casing. Subsequently, it is possible to electrically conductively connect the light-emitting semiconductor chips to one another by the connection elements. It is further possible to provide the light-emitting components with the desired number of light-emitting semiconductor chips by cutting through the casing before or after the connection elements are applied. The finished light-emitting components can then comprise one or more light-emitting semiconductor chips. That is to say, in particular, that the casing and optionally also the connection elements can have traces of a separation process. The tracks of the separating process can be, for example, sawing grooves or the like.

According to at least one embodiment of the method, the light-emitting semiconductor chip is formed by a light-emitting semiconductor chip described here, wherein the first end face comprises the first side surface of the substrate and the second end face comprises the second side surface of the substrate. Each current distribution structure is then brought into direct contact with precisely one of the connection elements during the method step of applying the connection elements.

In a method described here, it is further possible for the mold to be formed with reflective material, for example, in the form of metal foils or in the form of metal-plastic laminates, and for this material to remain at the desired places on the casing after removal of the mold. In this way, the casing can be covered with reflective material without further effort.

BRIEF DESCRIPTION OF THE DRAWINGS

In the following, the light-emitting semiconductor chips described here, the light-emitting components described here, and the methods for producing a light-emitting components described here are explained in more detail using exemplary embodiments and the corresponding figures.

FIG. 2G shows a first exemplary embodiment of a light-emitting component;

FIGS. 3A to 3C show second exemplary embodiments of a light-emitting component with the aid of schematic perspective representations.

Identical, similar or similar acting elements are provided with the same reference signs in the figures. The figures and the proportions of the elements shown in the figures are not to be regarded as true to scale. Rather, individual elements may be oversized to make them easier to display and/or understand.

DETAILED DESCRIPTION OF ILLUSTRATIVE EMBODIMENTS

Figure 1A:
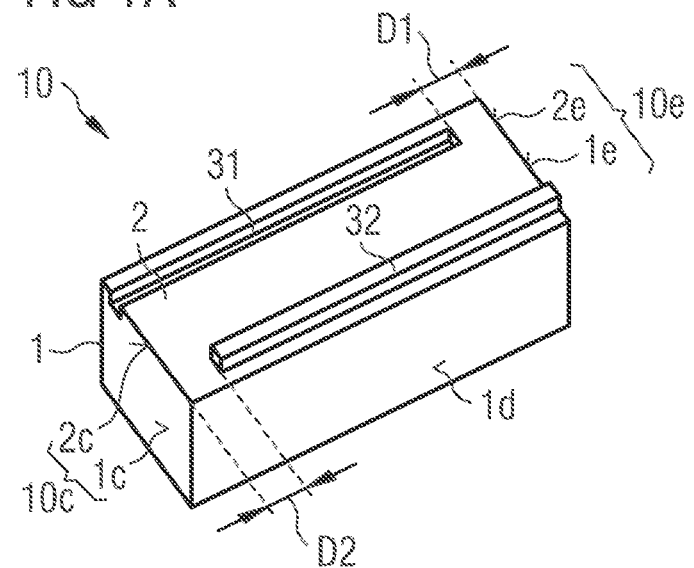
FIGS. 1A to 1D show exemplary embodiments of a light-emitting semiconductor chip.

FIG. 1A shows a first exemplary embodiment of a light-emitting semiconductor chip described here using a schematic perspective representation. The light-emitting semiconductor chip comprises a substrate 1, which may be, for example, a sapphire substrate. The substrate 1 comprises a first side surface is and a third side surface 1d, which has a larger surface area than the first side surface 1c. For example, the substrate 1 and thus the light-emitting semiconductor chip 10 are formed in the form of a square or rectangular column, in which the edge lengths on the first side surface is of the substrate are small compared to the edge lengths with the greatest extension in the region of the third side surface 1d. The semiconductor body 2 has a first side surface 2c facing the first side surface 1c. Furthermore, the semiconductor body has a second side surface 2e facing the second side surface 1e. The first side surface is of the substrate and the first side surface 2c of the semiconductor body 2 form the first end face 10c of the semiconductor chip. The second side surface 1e of the substrate 1 and the second side surface 2e of the semiconductor body 2 form the second end face 10e of the semiconductor chip 10.

In this case, it is possible that the first side surface is of the substrate is flush with the first side surface 2c of the semiconductor body, or that the side surface is of the substrate on the first side surface 2c of the semiconductor body protrudes from the semiconductor body. The same applies to the second end surface 10e of the semiconductor chip 10, on which the second side surface 1e of the substrate 1 can be flush with the second side surface 2e of the semiconductor body or is protruded by the second side surface 1e.

Figure 1B:
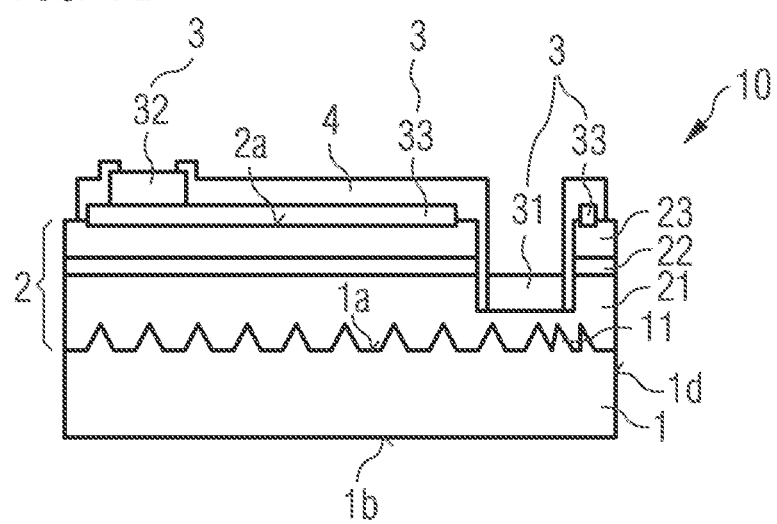

The sectional view of FIG. 1B shows that the substrate 1 furthermore has a bottom surface 1b and a top surface is opposite the bottom surface. The top surface 1a, for example, can be pre-structured. The substrate 1 then has structures 11 on the top surface 1a, which allow, for example, a defect-reduced growth of the semiconductor body 2.

The semiconductor body 2 is, for example, deposited epitaxially on the top surface is of the substrate 1. The semiconductor body 2 comprises a first conductive region 21, which is, for example, n-conducting, an active region 22 and a second conductive region 23, which can be formed in a p-conducting manner, for example.

The contacting 3 is formed on the top surface 2a of the semiconductor body 2 facing away from the substrate 1. The contacting 3 comprises a second current distribution structure 32, which is electrically conductively connected to the second conductive region 23 of the semiconductor body 2 via a current distribution layer 33. The current distribution layer 33 is, for example, a radiation-transmissive conductive layer, which is formed with a transparent conductive oxide such as, for example, ITO.

Furthermore, the contacting comprises a first current distribution structure 31, which can be in direct contact with the first conductive region 21. The current distribution structures 31, 32 are formed, for example, with a metal such as gold. In the present case, the current distribution structures 31, 32 extend along two straight lines on and in the semiconductor body 2. The first current distribution structure 31 is arranged in a trench, which completely penetrates the second conductive region 23 and the active region 24.

The current distribution structures 31, 32 are freely accessible from a side of the semiconductor body 2 facing away from the substrate. This means that the current distribution structures are not covered by further materials. Where they are not in contact with the semiconductor body 2 or the current distribution layer 33, they are electrically insulated from these components by in insulation 4, which is formed by an electrically insulating material such as silicon dioxide. On their side facing away from the substrate 1, however, they are freely accessible and therefore electrically contactable.

The light-emitting semiconductor chip 10 shown in connection with FIG. 1A is free of any connection point on the side of the semiconductor body 2 facing away from the substrate 1 and on the bottom surface 1b of the substrate 1, which is formed for electrically contacting the first and second current distribution structures 31, 32. In addition, the light-emitting semiconductor chip is free from any connection point, which is formed for electrically contacting the first and second current distribution structures. That is to say that the light-emitting semiconductor chip 10 of the exemplary embodiment of FIG. 1A can and must be contacted directly at the current distribution structures 31, 32, and no further connection point is provided for contacting the semiconductor chip.

In this case, the first current distribution structure 31 has a distance D1 to the second side surface 1e of the substrate 1. The second current distribution structure 32 has a distance D2 to the first side surface of the substrate 1c. The distances D1 and D2 are the distances between the plane, in which the side surface of the substrate lies and the plane, in which the end of the current distribution structure facing the side surface lies. The distances D1 and D2 can in particular also be selected to be the same within the scope of the production tolerance.

In the exemplary embodiment of FIG. 1A, the first current distribution structure 31 is drawn to the first side surface 1c, the second current distribution structure 32 is drawn to the second side surface 1e. That is to say that each current distribution structure has a distance to a side surface, while the current distribution structure on the opposite side surface terminates flush with the side surface of the substrate.

Figure 1C:
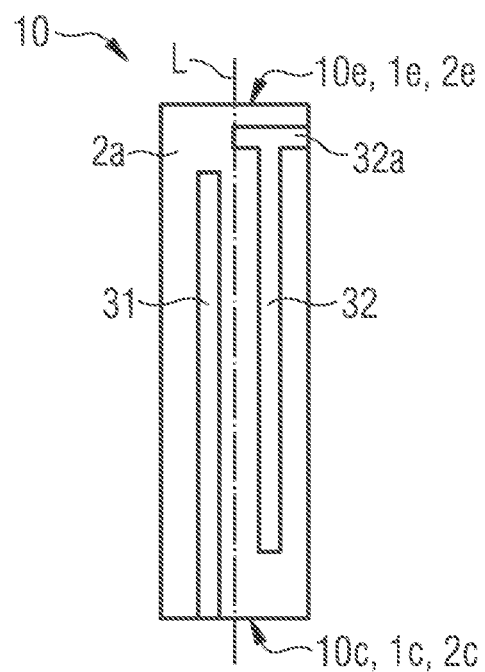

The schematic plan view of FIG. 1C shows an exemplary embodiment of a semiconductor chip 10 described here, in which the second current distribution structure 32 extends in an end region 32a, which faces the second side surface 1e, transversely to the longitudinal axis L of the top surface 2a of the semiconductor body 2. The end region 32a also extends transversely to the other direction of extent of the second current distribution structure 32, so that the second current distribution structure 32 has the shape of a "T". The first current distribution structure 31 can have a similar end region or no specially shaped end region on the first side surface 1c.

Figure 1D:
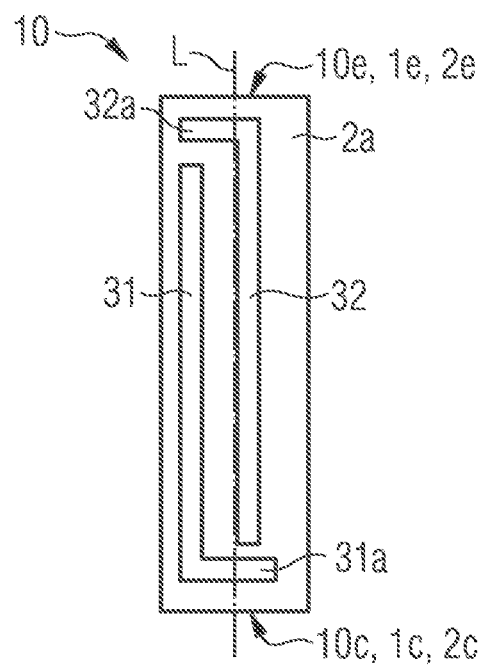

The schematic plan view of FIG. 1D shows an exemplary embodiment of a semiconductor chip described here, in which both current distribution structures 31, 32 each have an end region 31a, 32a, in which they extend transversely to the longitudinal axis L. Both current distribution structures have, for example, the shape of an "L".

Due to the end regions 31a, 32a, as shown in FIGS. 1C and 1D, the contact surface for contacting a current distribution structure 31, 32 on the side surface, to which the current distribution structure has a smaller distance than the respective other current distribution structure, is particularly large. The semiconductor chip can therefore be contacted in a particularly simple and reliable manner.

In connection with the schematic representations of FIGS. 2A to 2G, an exemplary embodiment of a method described here is explained in more detail.

For the method, initially a mold 6 is provided. The mold 6 is, for example, an injection mold. The mold 6 has an opening 63, in which in turn first recesses 6i and second recesses 62 are introduced, which are formed in the form and size such that they can receive a light-emitting semiconductor chip 10 in a form-fitting manner.

Figure 2A:
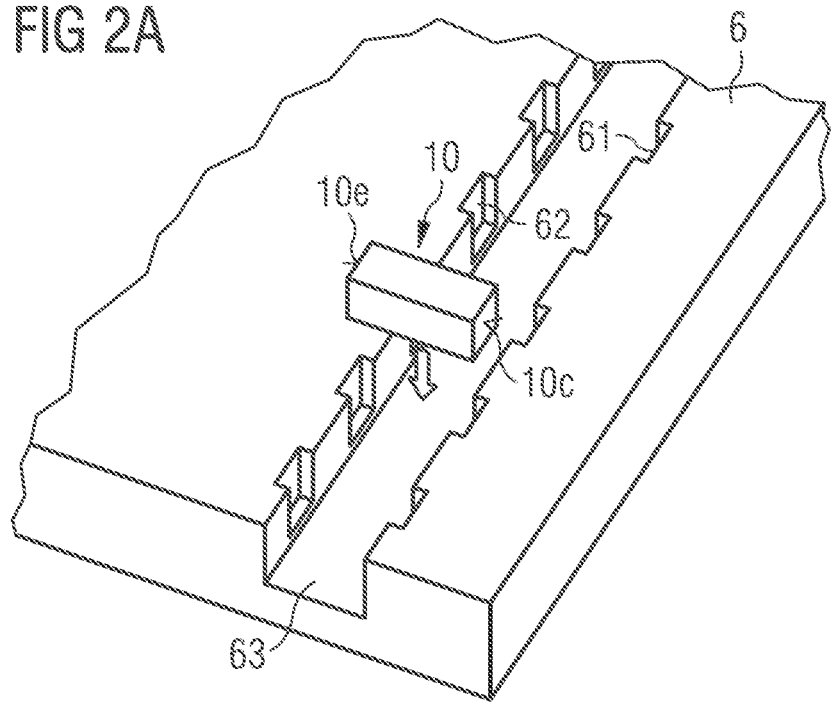
FIGS. 2A to 2G show exemplary embodiments of a method using schematic views.

In the next method step, FIG. 2A, the light-emitting semiconductor chips 10 are inserted into the opening 63 of the mold, so that the first end faces 10e are arranged in the first recess 6i and the second end faces 10e are arranged in the second recesses 62.

Figure 2B:
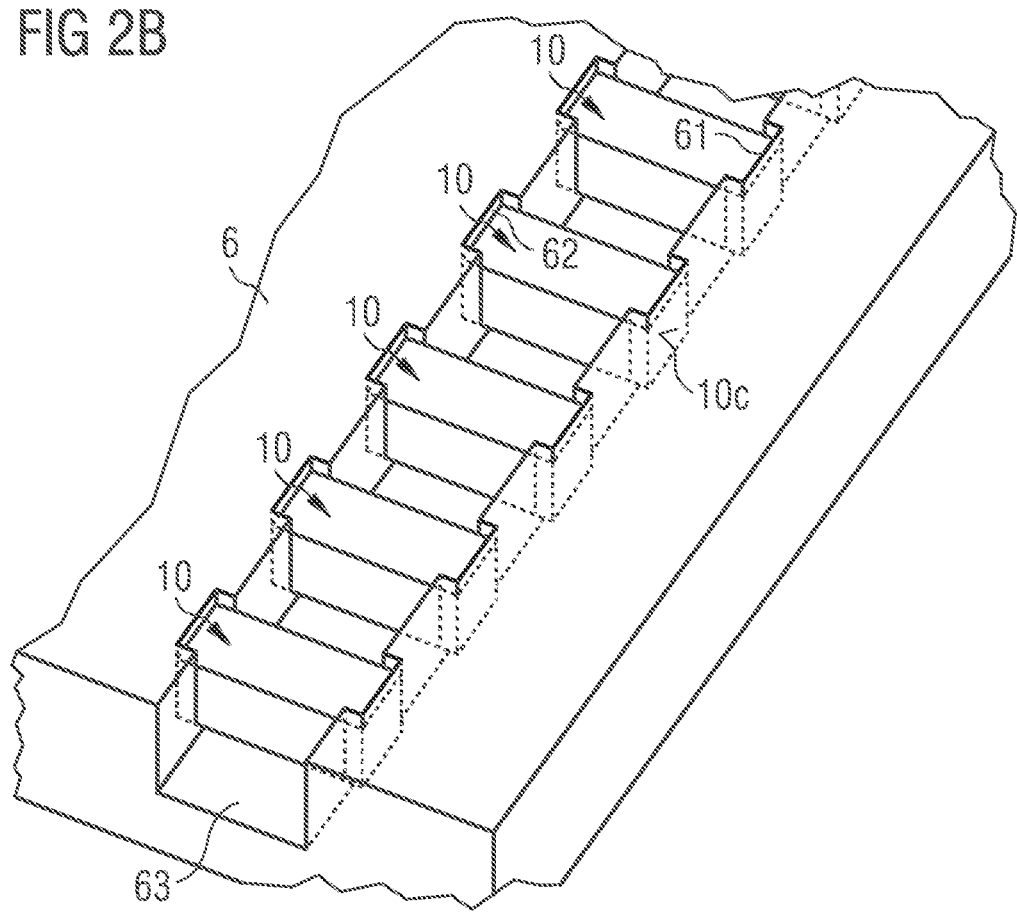
Figure 2C:
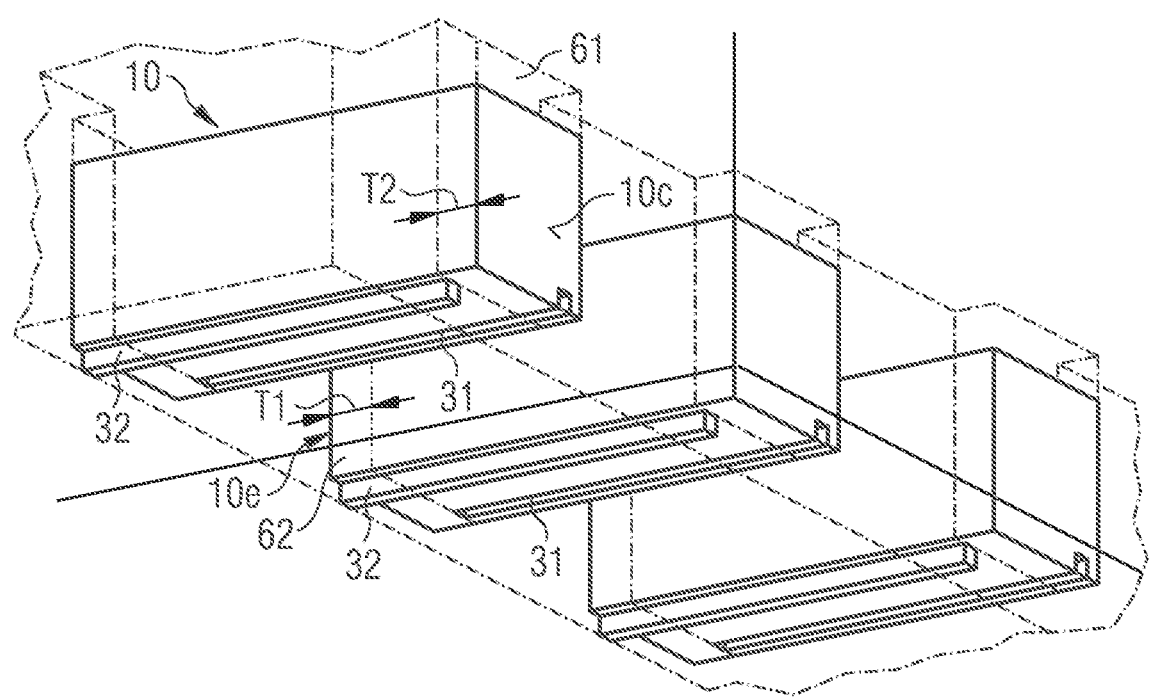
Figure 2D:
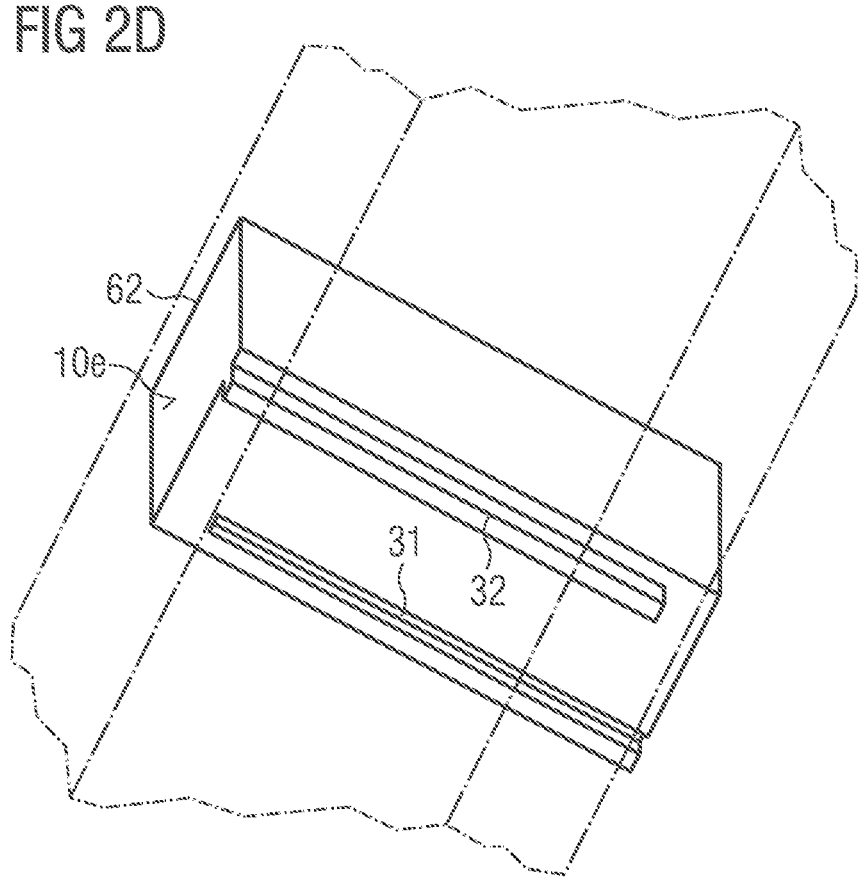

The result is a mold 6 equipped with light-emitting semiconductor chips 10, as is schematically shown in FIG. 2B. The same situation is represented from other viewing angles in FIGS. 2C and 2D. It can be seen that the end faces 10c and 10e of the light-emitting semiconductor chips 10 are covered by the recesses 61, 62. The light-emitting semiconductor chips are covered to a depth T1 at the first end face 10c and to a depth T2 at the second end face we. This depth corresponds, for example, to the respective distances of the current distribution structures from the end faces, to which they do not extend. That is to say that with the aid of the recesses 61, 62, it can be ensured in a simple manner that in each case a current distribution structure 31, 32 protrudes from the casing 8, while the other current distribution structure 32, 31 is covered by the casing.

The depths T1 and T2 of the recesses 61, 62 can be selected to be the same within the scope of the production tolerance. In this case, the light-emitting semiconductor chip protrudes at both end faces 10c, 10e at the same distance from the casing 8.

Figure 2E:
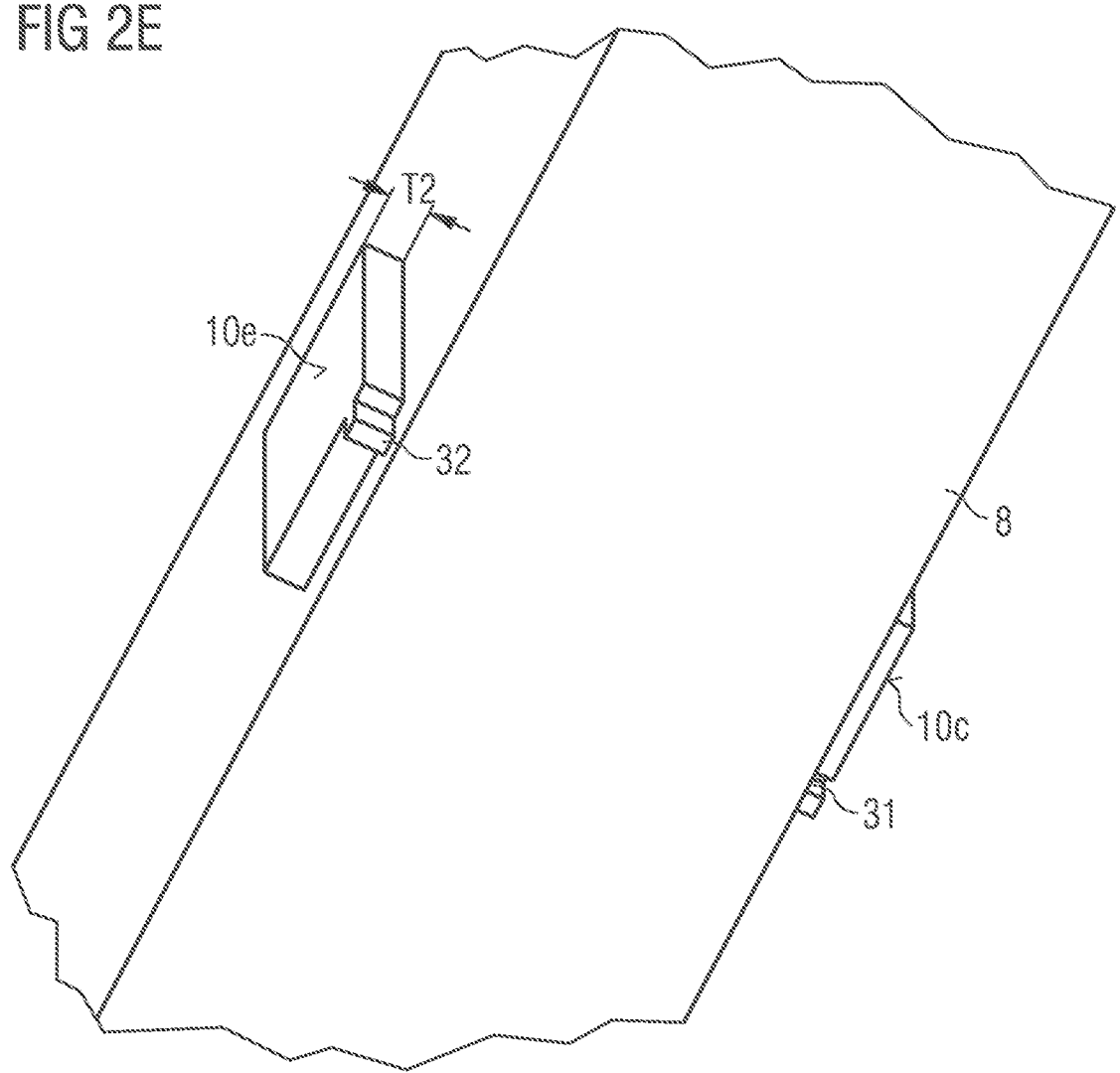
Figure 2F:
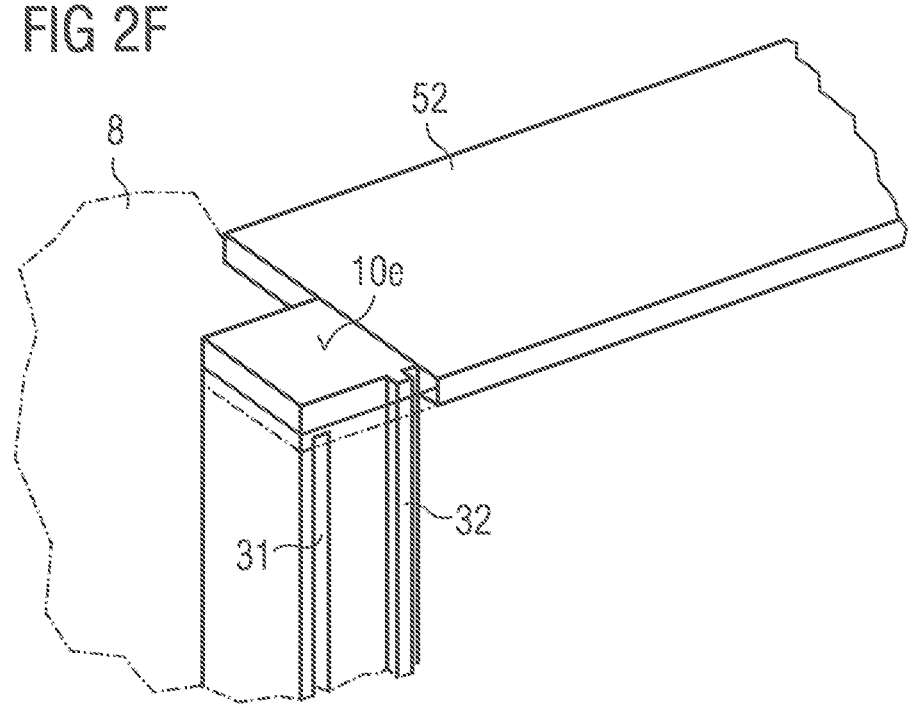

In the next method step, FIG. 2E, the casing material 8 is introduced into the opening 63 of the mold 6, cured and the mold is removed. As shown in FIG. 2E, the light-emitting semiconductor chip protrudes from the casing 8 at both end faces 10c, 10e. In this case, it protrudes over the casing 8 by the depths T1, T2 of the recesses 61, 62, such that the first current distribution structure 31 is exposed at the first end face 10c of the semiconductor chip 10 and the second current distribution structure 32 is completely covered. Wherein the second current distribution structure 32 is exposed at the second end face 10e and the first current distribution structure 31 is completely covered by the casing 8.

The distance D1 is selected to be slightly larger than the depth T2 and the distance D2 is selected to be slightly larger than the depth T1. In this way, it is ensured that the first current distribution structure 31 at the second end face me is completely covered by the casing 8 and the second current distribution structure 32 at the first end face 10c is completely enclosed by the casing 8.

In the next method step, the first connection elements 51 and the second connection elements 52 are applied, for example, as a metal coating to the exposed regions of the light-emitting semiconductor chips 10. No photo technology or other structuring is required for this purpose. Instead, the width of the connection elements 51, 52, can be formed generous and the connection to the light-emitting semiconductor chips 10 takes place in a self-aligning manner, since only the current distribution structure 31, 32 to be connected protrudes from the casing 8 and the current distribution structure 32, 31, which is not to be connected, is isolated through the casing 8. The connection elements are applied, for example, by sputtering. The connection elements 51, 52 can be formed in particular with a reflective material, so that in addition to their electrical properties for connection and their thermal properties as heat spreaders, they also act as a mirror and thus as optical elements in the finished component.

Figure 2G:
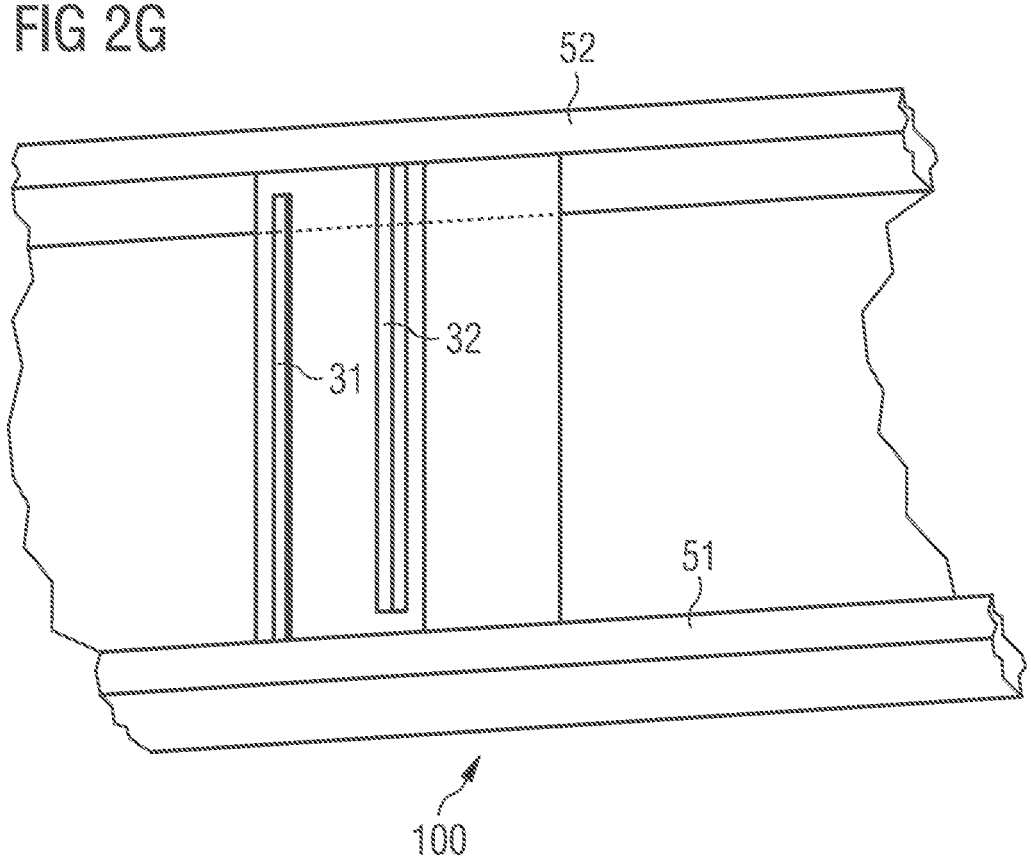

FIG. 2G shows a finished light-emitting component. FIG. 2G shows a light-emitting component described here with a light-emitting semiconductor chip 10, which comprises a first end face 10c and a second end face 10e opposite the first end face 10c; a casing 8 which is formed to be light-transmissive; a first connection element 51 for electrically contacting the light-emitting semiconductor chip 10; and a second connection element 52 for electrically contacting the light-emitting semiconductor chip 10, wherein the casing 8 surrounds the light-emitting semiconductor chip 10 in places; the light-emitting semiconductor chip 10 protrudes from the casing 8 at the first end face 10c; the light-emitting semiconductor chip 10 protrudes from the casing 8 at the second end face 10e; and the first connection element 51 and the second connection element 52 contact the light-emitting semiconductor chip 10 in the region of one of the end faces 10c, 10e respectively.

Figure 3A:
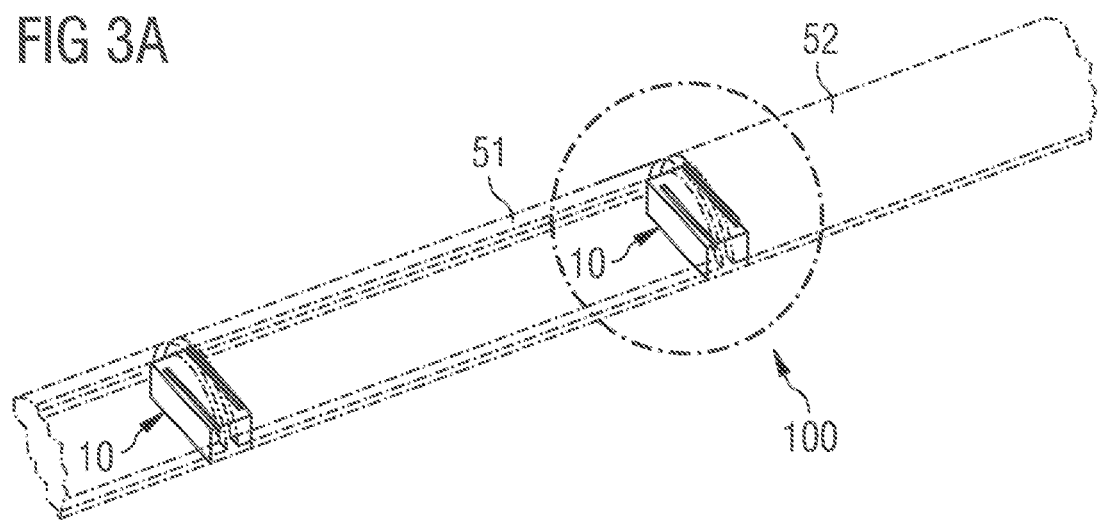
Figure 3B:
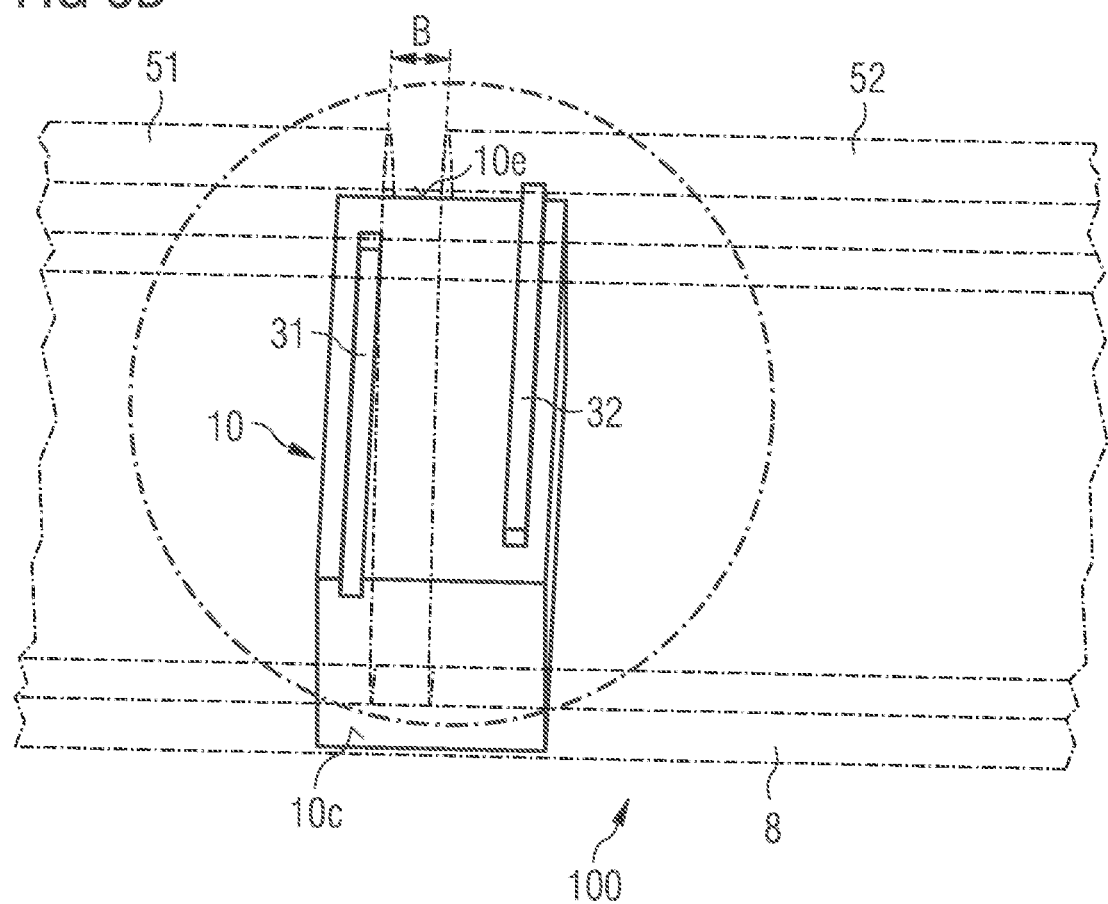

In connection with the schematic sectional representations of FIGS. 3A to 3C, a further exemplary embodiment of a light-emitting component described here is described. In this exemplary embodiment of the light-emitting component, the connection elements 51, 52 are used for the series connection of adjacent light-emitting semiconductor chips 10. As can be seen from FIG. 3A, for example, a first connection element 51 at a first light-emitting semiconductor chip 10 contacts the first connection element 51, whereas the same connection element contacts the second current distribution structure 32 at the adjacent light-emitting semiconductor chip. The current distribution structures 31, 32 are again exposed on opposite sides of the light-emitting semiconductor chips and protrude from the casing 8.

In contrast to the exemplary embodiment of the FIGS. 2A to 2G, the connection elements 51, 52 do not extend along the opposite end faces of the light-emitting semiconductor chips, but extend in each case from the first end face 10c to the second end face 10e. A distance B is present between the connection elements 51, 52.

As is shown in FIG. 3C, the connection elements 51, 52 can extend between the end faces 10c, 10e along a curved path, such that they extend in a dome-like manner over the light-emitting semiconductor chips. As a result, the connection elements 51, 52 can form reflectors, which have, for example, the shape of a concave mirror, for example, the shape of a parabolic mirror. Such a light-emitting component can be used in this way, for example, as a replacement for a conventional fluorescent tube. In the exemplary embodiment of FIGS. 3A to 3C, the semiconductor body, which is covered in places by the current distribution structures 31, 32, faces the connection elements 51, 52, whereas the uncovered bottom surface of the substrate 1 faces away from the connection elements 51, 52, so that light emerging there leaves the component during operation without subsequent reflection at the connection elements 51, 52.

In addition to the described exemplary embodiments of the light-emitting semiconductor chips described here, the light-emitting components described here and the processes described here, numerous further variants are conceivable. For example, it is possible to introduce further components, such as, for example, drive circuits and/or protective diodes into the casing, which can be electrically conductively connected to the light-emitting semiconductor chips via the connection elements. Furthermore, it is possible that so-called quantum dots are introduced into the casing as luminescence conversion material, which can be protected particularly well from external, in particular chemical influences, by the casing material and the connection elements. Furthermore, it is possible to deposit the connection elements by means of other application methods such as sputtering, e.g., by galvanic application. In this case, it is also possible in particular that the connection elements comprise two or more layers, which can take different tasks in the component. Overall, light-emitting semiconductor chips described here and light-emitting components described here can be produced in a particularly simple and thus particularly cost-effective manner.

Figure 4A:
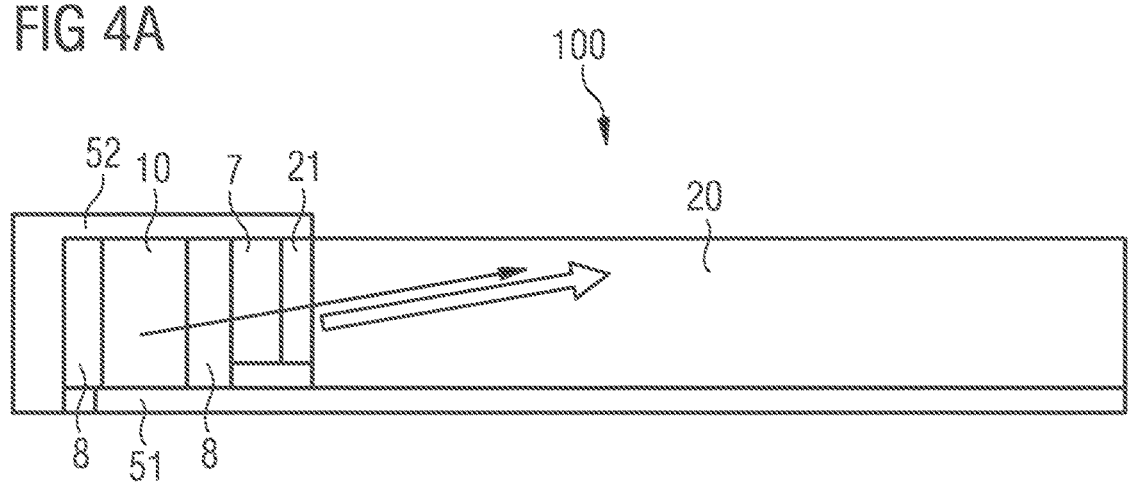
FIGS. 4A to 4B show third exemplary embodiments of a light-emitting component with the aid of schematic representations.
Figure 4B:
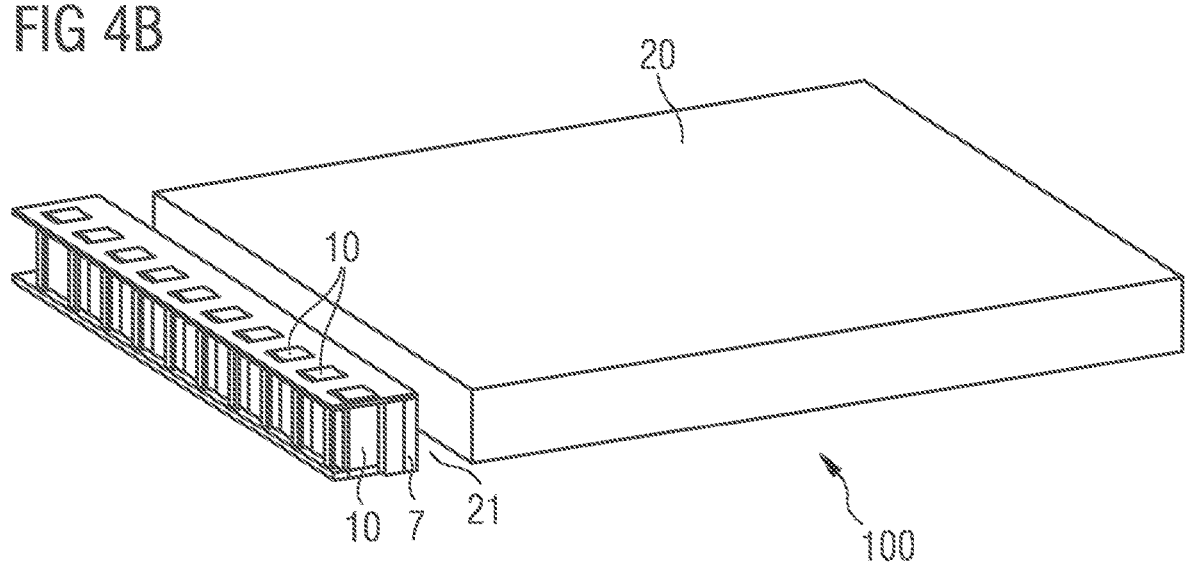

In connection with the schematic representations of FIGS. 4A and 4B, a third exemplary embodiment of a light-emitting component described here is explained in more detail. In the third exemplary embodiment, the light-emitting component 100 comprises a light guide 20. The light guide 20 is formed, for example, with a light-transmissive, in particular with a clear, transparent material. Light-emitting semiconductor chips 10 described here are arranged on an end face of the light guide 20, which are surrounded by the common casing 8.

For example, a conversion element 7 can be arranged between the light guide 20 and the light-emitting semiconductor chips 10. In contrast to an embodiment in which a luminescence conversion material is introduced into the casing 8, it is possible in this embodiment to introduce the luminescence conversion material in a specifically into the conversion element 7 and thus introduce the luminescence conversion material only therein, where light of the semiconductor chip 10 is radiated in the direction of the light guide 20. This can help to reduce the amount of required luminescence conversion material.

However, it is also possible to dispense with the conversion element 7. The component can then be produced in a particularly simple manner.

In addition, a gap 21 can be arranged between the conversion element 7 and the light guide 20, which can be filled with a material, for example, which has a lower refractive index than the light guide 20 and/or the conversion element 7. This can improve the coupling of light into the light guide 20.

As can be seen in particular from the schematic sectional view of FIG. 4A, the first connection element 51 extends over the entire bottom surface of the light guide 20 and serves there, for example, as a reflector for the mixed radiation emitted by the semiconductor chips 10 and the conversion element 7, which can be white light, for example. The top surface of the light guide 20 opposite the bottom surface is free of a connection element. However, the second connection element 52 extends, for example, over the conversion element 7 and on a side surface of the casing 8, which faces away from the end face of the light guide 20 and is likewise used as a reflector and for dissipating heat generated during operation in the conversion element 7. For reasons of clarity, the connection elements 51, 52 are not shown in the schematic perspective representation of FIG. 4B.

Overall, the connection elements 51, 52 in the exemplary embodiment of FIGS. 4A and 4B serve as reflectors, in particular of the light guide 20, and as a heat spreader for the heat loss generated during operation of the conversion element 7 and in the semiconductor chips 10. In this way, a particularly compact light-emitting component is realized, which can be produced in a simple manner and is particularly durable due to the efficient dissipation of heat loss.

The invention is not restricted to the exemplary embodiments by the description on the basis of the exemplary embodiments. Rather, the invention includes each new feature and each combination of features, which includes in particular each combination of features in the patent claims, even if this feature or this combination itself is not explicitly indicated in the patent claims or exemplary embodiments.

The invention claimed is:

1. A light-emitting semiconductor chip comprising:
    a light-transmissive substrate having a top surface, a bottom surface opposite the top surface, a first side surface extending transversely or perpendicularly to the bottom surface, and a second side surface arranged opposite the first side surface;
    a semiconductor body arranged on the top surface of the substrate, the semiconductor body comprising an active region configured to generate light; and
    a contacting comprising a first current distribution structure and a second current distribution structure, the contacting configured to supply current to the active region,
    wherein the first current distribution structure and the second current distribution structure are freely accessible from a side of the semiconductor body facing away from the substrate,
    wherein the semiconductor chip, on the side of the semiconductor body facing away from the substrate and on the bottom surface of the substrate, is free of any connection point configured to electrically contact the first and second current distribution structures, wherein the first current distribution structure has a smaller distance to the first side surface than the second current distribution structure, and wherein the second current distribution structure has a smaller distance from the second side surface than the first current distribution structure.

2. The light-emitting semiconductor chip according to claim 1, wherein the semiconductor chip is free of any connection point configured to electrically contact the first and second current distribution structures.

3. The light-emitting semiconductor chip according to claim 1, wherein the first current distribution structure has an end region on the first side surface, in which the first current distribution structure extends transversely or perpendicularly to a longitudinal axis of the top surface of the semiconductor body facing away from the substrate, and/or wherein the second current distribution structure has an end region on the second side surface, in which the second current distribution structure extends transversely or perpendicularly to the longitudinal axis.

4. The light-emitting semiconductor chip according to claim 1, wherein the first current distribution structure extends to a first end face of the semiconductor chip and terminates at the first end face flush with the first side surface of the substrate and/or the first side surface of the semiconductor body.

5. The light-emitting semiconductor chip according to claim 4, wherein the second current distribution structure extends to a second end face of the semiconductor chip and terminates at the second end face flush with the second side surface of the substrate and/or the second side surface of the semiconductor body.

6. The light-emitting semiconductor chip according to claim 5, wherein the first end face and the second end face are arranged opposite one another.

7. A light-emitting component comprising:
a light-emitting semiconductor chip comprising a first end face and a second end face opposite the first end face;
a light-transmissive casing;
a first connection element for electrically contacting the light-emitting semiconductor chip; and
a second connection element for electrically contacting the light-emitting semiconductor chip,
wherein the casing surrounds the light-emitting semiconductor chip in places,
wherein the light-emitting semiconductor chip protrudes from the casing at the first end face,
wherein the light-emitting semiconductor chip protrudes from the casing at the second end face, and
wherein the first connection element and the second connection element contact the light-emitting semiconductor chip in a region of one of the end faces respectively.

8. The light-emitting component according to claim 7, wherein the first connection element completely covers the first end face, and wherein the second connection element completely covers the second end face.

9. The light-emitting component according to claim 7, wherein the first connection element covers the first end face and the second end face, and wherein the second connection element covers the first end face and the second end face.

10. The light-emitting component according to claim 7, wherein the first connection element and the second connection element are in direct contact with the light-emitting semiconductor chip and the casing.

11. The light-emitting component according to claim 7, wherein the light-emitting component comprises two or more light-emitting semiconductor chips being electrically conductively connected to one another.

12. The light-emitting component according to claim 7, wherein the light-emitting component comprises two or more light-emitting semiconductor chips, which are electrically conductively connected to one another, and wherein mutually adjacent semiconductor chips are electrically conductively connected to one another by the first connection element and/or the second connection element.

13. The light-emitting component according to claim 7, wherein the first end face comprises a first side surface of a substrate, wherein the second end face comprises a second side surface of the substrate, and wherein each current distribution structure is in direct contact with precisely one of the connection elements.

14. The light-emitting component according to claim 7, wherein the casing completely covers a first current distribution structure in the region of each of the end faces and a second current distribution structures projects from the casing and is free of the casing in places.

15. The light-emitting component according to claim 7, further comprising a light guide, wherein the light-emitting semiconductor chip is arranged on an end face of the light guide, and wherein the first connection element and/or the second connection element covers an outer surface of the light guide in places.

16. A method for producing a light-emitting component, the method comprising:
providing a mold having an opening, a first recess in the opening and a second recess in the opening;
providing a light-emitting semiconductor chip comprising a first end face and a second end face opposite the first end face;
inserting the light-emitting semiconductor chip into the opening of the mold such that the first end face is arranged in the first recess and the second end face is arranged in the second recess;
introducing a light-transmissive casing into the opening such that the casing surrounds the light-emitting semiconductor chip except for regions of the light-emitting semiconductor chip, which are arranged in the first recess and in the second recess;
removing the mold; and
applying a first connection element and a second connection element for electrically contacting the light-emitting semiconductor chip in regions of the light-emitting semiconductor chip not covered by the casing.

17. The method according to claim 16, wherein two or more light-emitting semiconductor chips are provided, and wherein the mold has a first recess and a second recess for each of the semiconductor chips.

18. The method according to claim 16, wherein the first end face comprises a first side surface of a substrate, wherein the second end face comprises a second side surface of the substrate, and wherein each current distribution structure is brought into direct contact with precisely one of the connection elements.

19. The method according to claim 16, wherein the light-emitting component comprises the light-emitting semiconductor chip comprising a first end face and a second end face opposite the first end face, the light-transmissive casing, the first connection element for electrically contacting the light-emitting semiconductor chip and the second connection element for electrically contacting the light-emitting semiconductor chip, wherein the casing surrounds the light-emitting semiconductor chip in places, wherein the light-emitting semiconductor chip protrudes from the casing at the first end face, wherein the light-emitting semiconductor chip protrudes from the casing at the second end face, and wherein the first connection element and the second connection element contact the light-emitting semiconductor chip in a region of one of the end faces respectively.

\* \* \* \* \*